United States Patent [19]
Lee et al.

[11] Patent Number: 5,324,680
[45] Date of Patent: Jun. 28, 1994

[54] SEMICONDUCTOR MEMORY DEVICE AND THE FABRICATION METHOD THEREOF

[75] Inventors: Kyu-pil Lee; Yong-jik Park, both of Suwon, Rep. of Korea

[73] Assignee: Samsung Electronics, Co. Ltd., Seoul, Rep. of Korea

[21] Appl. No.: 867,856

[22] Filed: Apr. 13, 1992

Related U.S. Application Data

[60] Division of Ser. No. 710,574, Jun. 5, 1991, abandoned, which is a continuation of Ser. No. 704,301, May 22, 1991, abandoned.

[51] Int. Cl.$^5$ ............................................. H01L 21/70
[52] U.S. Cl. .................................... 437/52; 437/44; 437/48
[58] Field of Search ................. 437/44, 47, 48, 52, 437/60

[56] References Cited

U.S. PATENT DOCUMENTS

| | | | |
|---|---|---|---|
| 4,577,391 | 3/1986 | Hsia et al. | 437/44 |
| 4,837,173 | 6/1989 | Alvis et al. | 437/44 |
| 4,845,544 | 7/1989 | Shimizu | |
| 4,882,289 | 11/1989 | Moriuchi et al. | |
| 4,975,385 | 12/1990 | Beinglass et al. | 437/44 |
| 4,977,099 | 12/1990 | Kotaki | 437/44 |
| 5,071,784 | 12/1991 | Takeuchi et al. | 437/52 |
| 5,135,881 | 8/1992 | Saeki | 437/52 |
| 5,153,144 | 10/1992 | Komori et al. | 437/52 |

Primary Examiner—Tom Thomas
Attorney, Agent, or Firm—Morgan & Finnegan

[57] ABSTRACT

This invention relates to a semiconductor memory device having a cell array and a peripheral circuit and the fabrication method thereof. A semiconductor memory device and the fabrication method are provided wherein source and drain impurity diffusion regions of transistors constituting the cell array have an impurity concentration lower than that of source and drain impurity diffusion regions of transistors constituting the peripheral circuit Thus, the junction's breakdown voltage characteristic of the transistor in the cell array is improved, and the data inverting phenomenon and refresh characteristic deterioration problem due to the leakage current of the transistor in the peripheral circuit area are both solved.

10 Claims, 4 Drawing Sheets

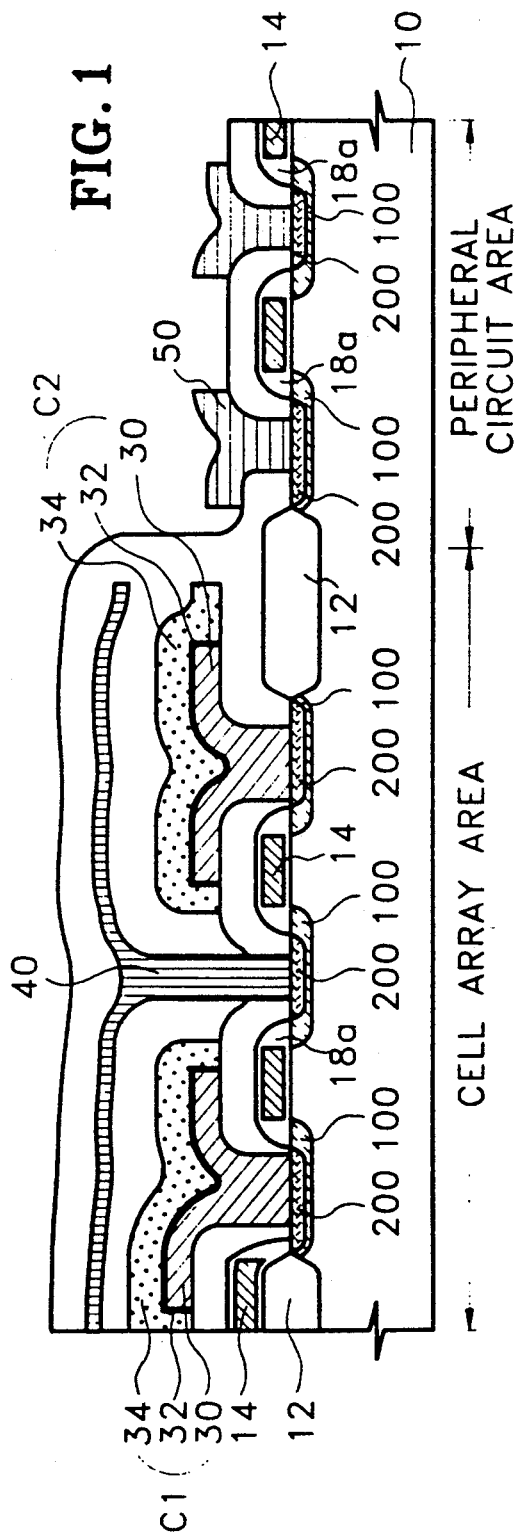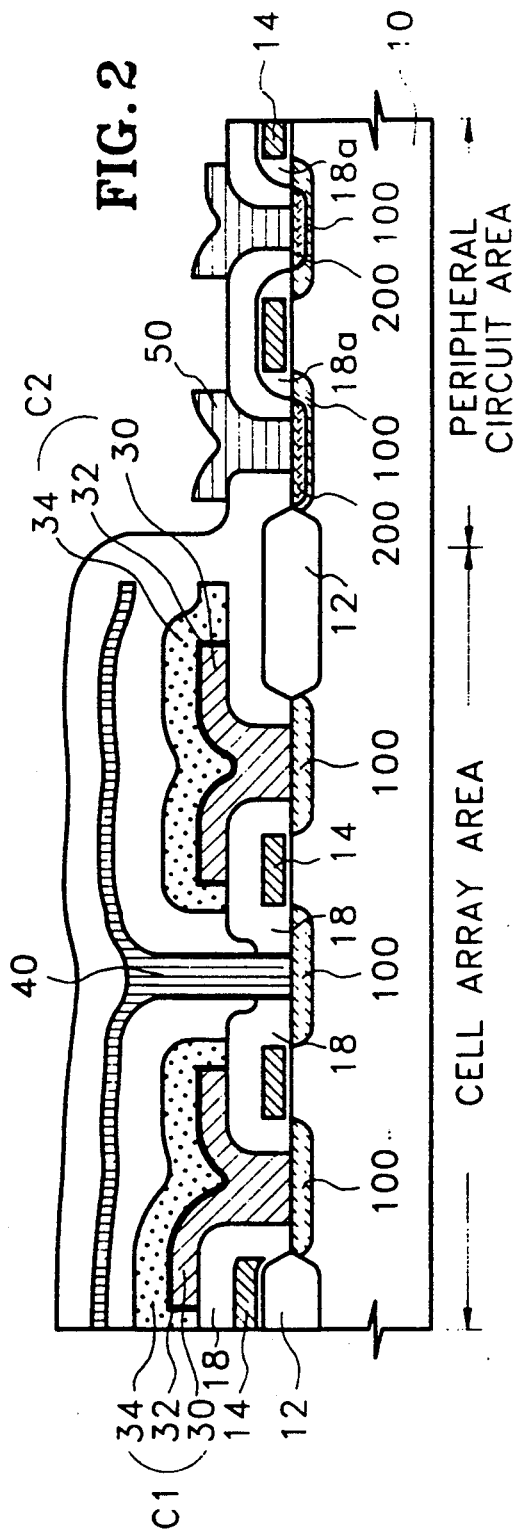

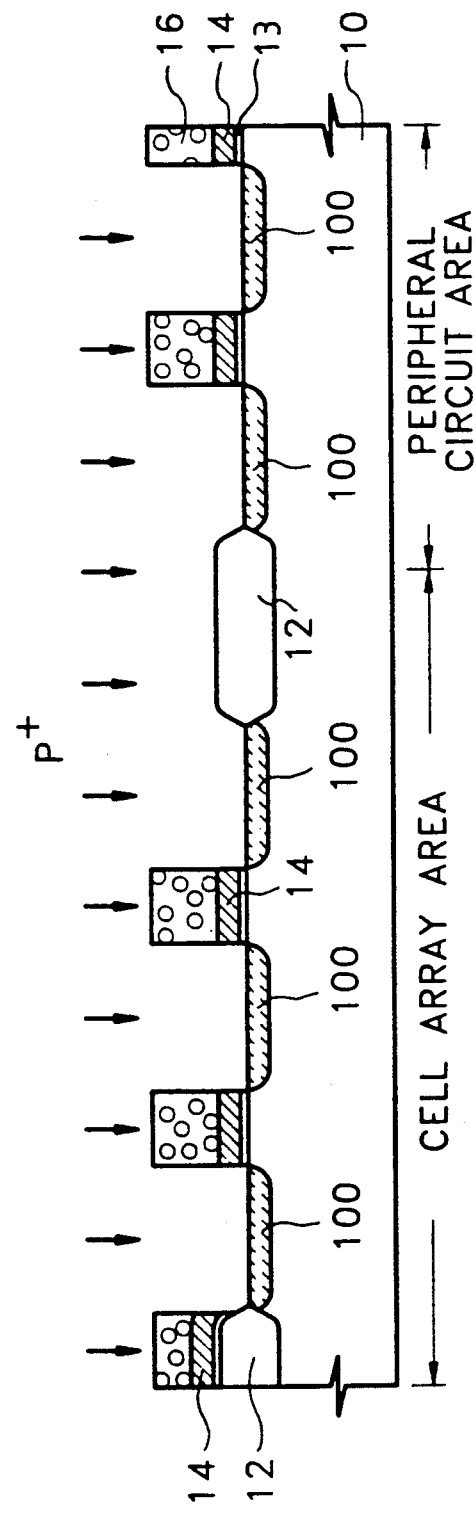
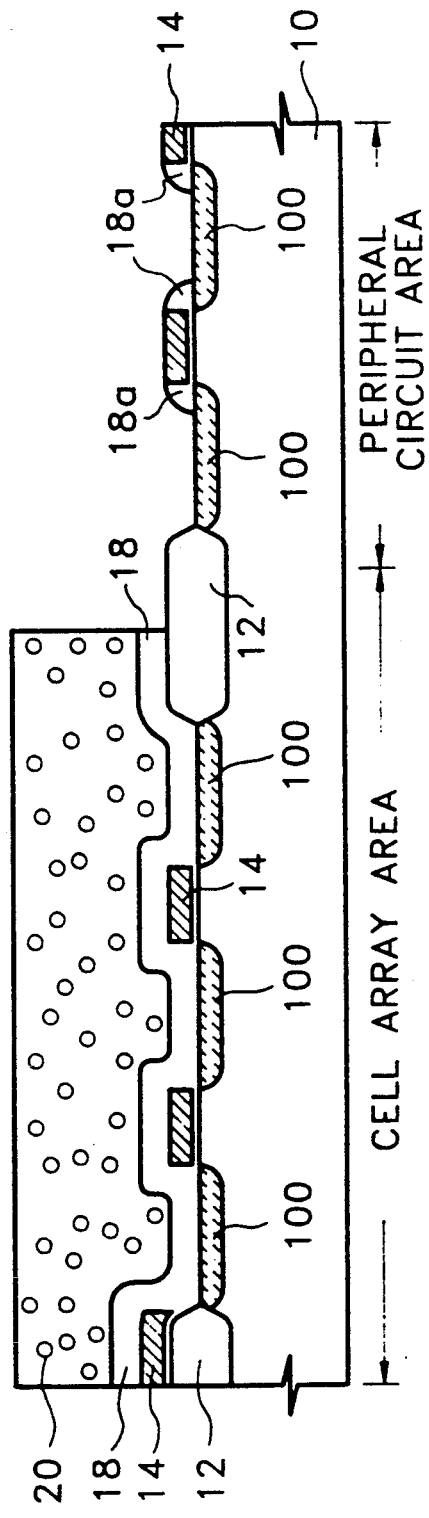

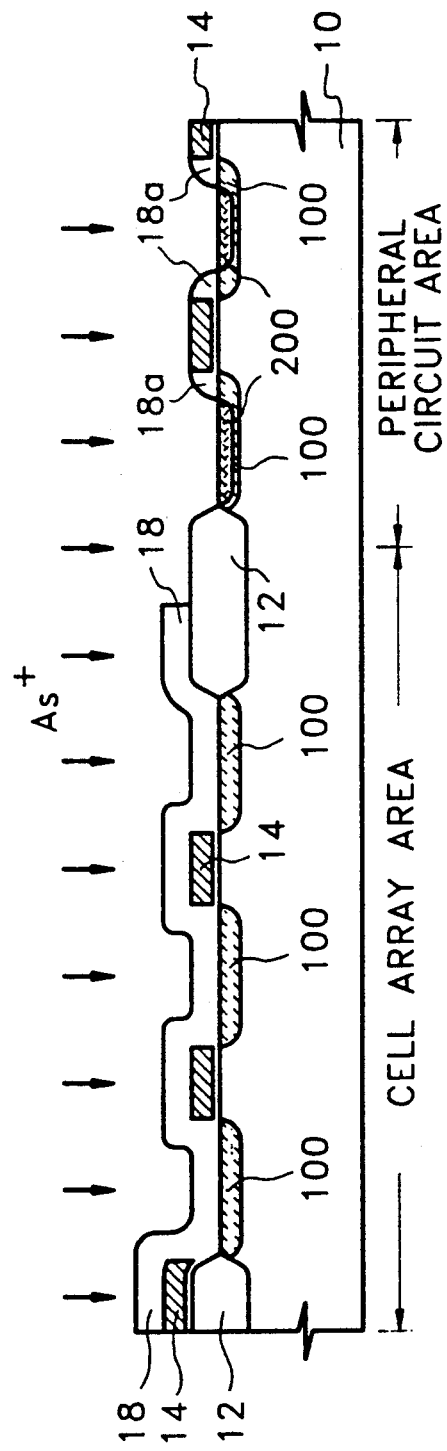
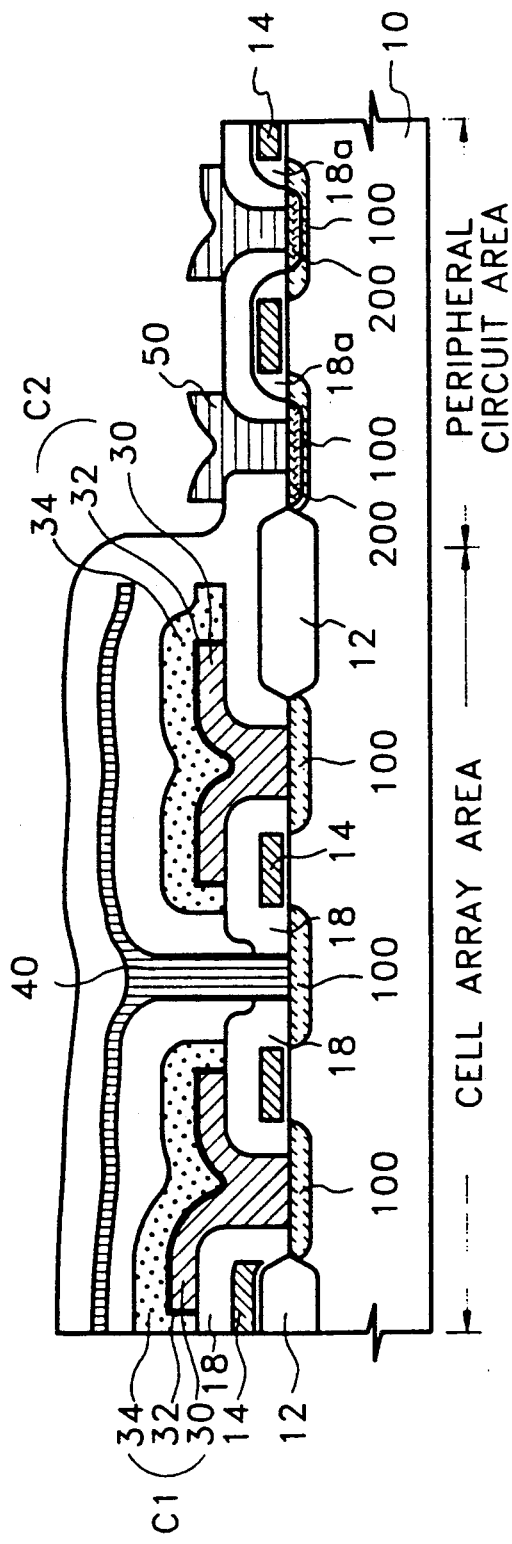

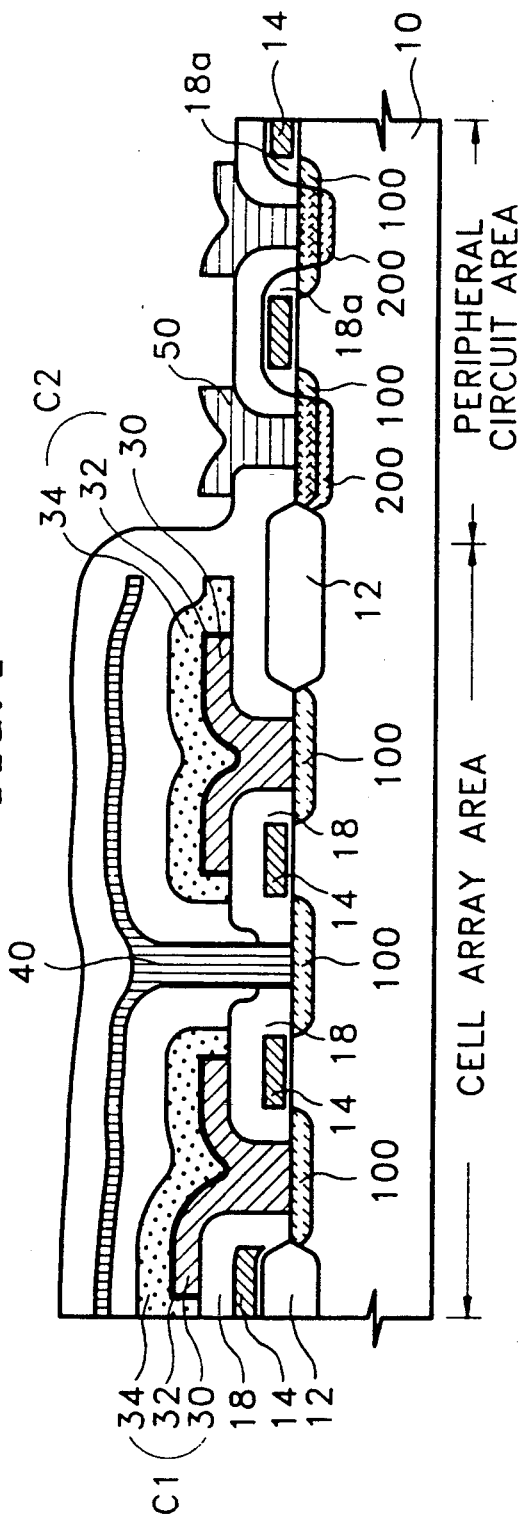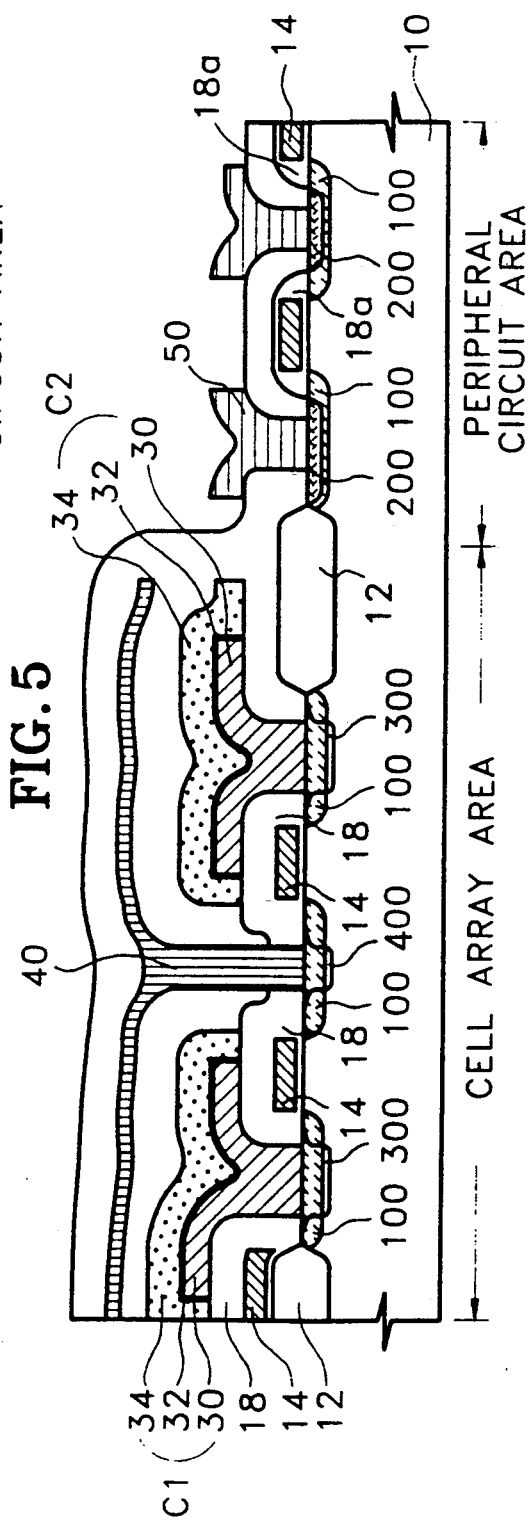

SEMICONDUCTOR MEMORY DEVICE AND THE FABRICATION METHOD THEREOF

This is a divisional of application Ser. No. 07/710,574, filed Jun. 5, 1991, now abandoned, which is a continuation of application of the same inventors, entitled SEMICONDUCTOR MEMORY DEVICE AND THE FABRICATION METHOD THEREFOR, filed on May 22, 1991, Ser. No. 07/704,301, now abandoned.

BACKGROUND OF THE INVENTION

The present invention relates to a semiconductor memory device and a fabrication method therefor, in which the impurity concentration of the source and drain regions of transistors within a cell array is lower than that within a peripheral circuit.

Semiconductor memory devices of the type with which this invention is concerned typically consist of two areas. The first is a cell array area in which DRAM (Dynamic Random Access Memory) cells are arranged in a matrix. Each cell array area contains a transistor, a capacitor, and a word line connected to a bit line. The second area is a peripheral circuit area for storing and transmitting data and for driving the cell array.

In semiconductor memory devices, miniaturization of unit cells to increase memory, high speed switching to transmit and store the data more quickly, and accurate reading and writing of data in the cell array are all being widely studied FIG. 1 shows a sectional view of a cell array and peripheral circuit manufactured by a conventional method. More particularly, FIG. 1 shows the border between the cell array area and the peripheral circuit area constituting semiconductor memory device, thereby checking the variation in the reliability of the memory device according to characteristic variation in transistors constituting the two regions.

In this drawing, a DRAM cell array area includes a transistor commonly having a drain region within an active region defined by a field oxide film 12 and having a source region and a gate electrode, and a capacitor in contact with the source region of the transistor and having a storage electrode, a dielectric film and a plate electrode. Transistors constituting the peripheral circuit are disposed in the periphery of the cell array. Generally, the impurity diffusion region of a transistor is formed by forming a gate electrode on the substrate and then doping an impurity using the gate electrode as a mask.

While smaller transistors are available to manufacture an effective highly integrated memory device, the power supplied remains constant regardless of size reduction, thereby increasing the electric field strength inside the transistor. Particularly, in the pinch-off region near the drain, the electric field becomes much stronger such that hot carriers are generated by the strong electric field in the region. The hot carrier is accelerated by the electric field to be injected into the gate oxide film. Otherwise, the hot carrier obtains an energy which overcomes the band gap of the substrate silicon, such that new electron/hole pairs are generated according to the impact ionization; part of the newly generated electrons are injected into the gate oxide film depending on the strength of the electrical field of the drain and part flow into the substrate and generate substrate current.

If a hot carrier is injected into the gate oxide film, a new interface state is generated between the substrate and the oxide film which changes the threshold voltage or deteriorates mutual conductance. If part of the holes flow within the substrate, the substrate voltage increases and causes parasitic bipolar breakdown, thereby deteriorating the withstand voltage of the drain region, and consequently hindering the memory characteristic.

To decrease the hot carrier effect due to a strong electric field as described above, a transistor is manufactured to have a double impurity diffusion region by thinly doping an impurity of low concentration in the substrate using the gate electrode as a mask. Then a spacer is formed on the side wall of the gate electrode, and again an impurity of high concentration using the spacer as a mask is doped. In this structure, called an LDD (Lightly Doped Drain) structure, an impurity diffusion region of low concentration is formed near the gate electrode and in the drain region, thereby decreasing the hot-carrier effect by weakening the electrical field therein. Generally, in the LDD structure a first impurity diffusion region 100 is first thinly formed by doping phosphorus using the gate electrode as a mask, and successively, a second impurity diffusion region 200 of a high concentration is thickly formed by disposing a spacer 18a on the side wall of the gate electrode 14 and then doping arsenic using the spacer as a mask.

The cell array area and the peripheral circuit area of the conventional semiconductor device using the LDD structure can improve the current driving capability by the above-mentioned effects, but an impurity diffusion process carried out in two steps causes leakage current in the memory cells of the cell array area. This results in a data inverting phenomenon which deteriorates the refresh characteristic of the memory cell. This is because there are minute defects in the semiconductor substrate itself due to the process of coating and etching an oxide film on a substrate on which a gate electrode has been formed, in order to form the second impurity diffusion region or the process for doping an impurity of high concentration. The defects become a factor contributing to the substrate leakage current, which cause the inversion of data stored in the capacitor.

SUMMARY OF THE INVENTION

It is an object of the present invention to provide a semiconductor memory device in which an impurity diffusion concentration of a transistor within a cell array is lower than the diffusion concentration within a peripheral circuit to make a highly reliable memory device which improves the conditions of the above-described conventional semiconductor memory device.

It is another object of the present invention to provide a fabrication method suitable to manufacture the semiconductor memory device.

To achieve an object of the present invention, the semiconductor memory device having a cell array and a peripheral circuit is characterized in that the source and drain impurity diffusion regions of transistors constituting the cell array have an impurity concentration lower than that of the source and drain impurity diffusion regions of transistors constituting the peripheral circuit.

To achieve another object of the present invention, in the semiconductor memory device having a cell array and a peripheral circuit, the transistors constituting the cell array and the peripheral circuit are manufactured by the steps of:

forming a field oxide film on a first conductive type semiconductor substrate;

laminating and etching a gate oxide film and a first conductive layer on the whole surface of the semiconductor substrate to form a gate electrode;

doping a second conductive type impurity on the whole surface of the semiconductor substrate, on which a gate electrode has been formed, to form a first impurity diffusion region;

forming a spacer material on the whole surface of the substrate on which the first impurity diffusion region has already been formed;

coating a photoresist on the whole surface and removing the photoresist of the peripheral circuit area by a photolithography process;

anisotropically etching the spacer forming material to form a spacer on the side wall of the gate electrode of the transistor arranged in the peripheral circuit area, and removing the remaining photoresist; and doping a second conductive type impurity using the spacer as mask to form a second impurity diffusion region.

BRIEF DESCRIPTION OF THE DRAWINGS

The above objects and other advantages of the present invention will become more apparent by describing the preferred embodiments of the present invention with reference to the attached drawings, in which:

FIG. 1 is a sectional view of a cell array and a peripheral circuit manufactured by a conventional method;

FIG. 2 is a sectional view of a cell array and a peripheral circuit manufactured by an embodiment of the present invention;

FIGS. 3A through 3D are sectional views showing the sequential fabrication process of a cell array and a peripheral circuit by an embodiment of the present invention;

FIG. 4 is a sectional view of a cell array and a peripheral circuit manufactured by another embodiment of the present invention; and FIG. 5 is a sectional view of a cell array and a peripheral circuit manufactured by still another embodiment of the present invention.

DETAILED DESCRIPTION OF THE INVENTION

FIG. 2 is a sectional view showing a semiconductor memory device according to the present invention. Disposed in a cell array area is a DRAM cell which has two transistors which commonly have a drain region in an active region defined by a field oxide film 12 and have respective source regions and gate electrodes, and two capacitors each of which is in contact with the source region of the transistor and consists of a storage electrode, a dielectric film and a plate electrode. In the periphery of the cell array area, transistors constituting a peripheral circuit are disposed. Here, source and drain impurity diffusion regions of transistors in the cell array area have an impurity concentration lower than that of the source and drain impurity diffusion regions of transistors in the peripheral circuit area.

FIGS. 3A through 3D are sectional views showing the sequential fabrication process of a semiconductor memory device according to the present invention.

First, FIG. 3A shows a process for forming gate electrodes 14 and first impurity diffusion regions 100 on a semiconductor substrate 10. A field oxide film 12 is formed on the P-type semiconductor substrate 10 to separate the semiconductor substrate into active and an inactive regions. Then, a thin gate oxide film 13 and a polycrystalline silicon layer for forming the gate electrode are laminated on the whole surface. Successively, a photoresist is coated over the whole surface of the polycrystalline silicon layer, and a mask pattern 16 for forming an electrode is made via an exposing and etching process. The gate electrodes 14 are completed by anisotropically etching the polycrystalline silicon layer and the gate oxide film using the mask pattern 16 as a mask. Successively, an N-type impurity such as phosphorus is diffused on the whole surface of the substrate using the gate electrode as a mask, thereby forming the self-aligned first impurity diffusion region on source and drain regions of each transistor. In this case, the impurity concentration of the first impurity diffusion region is a suitably low concentration, for instance, below $10^{18}/cm^3$. The first impurity diffusion region may be formed by injecting 1.6 E12 ions/$CM^2$ at 80 KeV.

FIG. 3B shows a process for forming spacers on the side walls of the gate electrodes. A spacer material 18, either a conductive material or an insulating material, is formed to a thickness of approximately 1700Å on the semiconductor substrate on which the first impurity diffusion region 100 has been self-aligned, and a photoresist is coated over the whole surface of the material. Successively, the photoresist coated over the peripheral circuit area only is removed by a photolithography process to form a photoresist pattern 20, so that the spacer material 18 formed on the peripheral circuit area is exposed. The exposed spacer material is anisotropically etched to leave a residue on the side walls of the gate electrodes 14, so that spacers 18a are formed.

FIG. 3C shows a process for forming a second impurity diffusion region 200 on the peripheral circuit area. Before or after the photoresist pattern 20 is removed, an N-type impurity such as Arsenic is doped with a high concentration, above $10^{20}/cm^3$, to diffuse the impurity of a high concentration on the first impurity diffusion region formed on the peripheral circuit area, thereby forming the second impurity diffusion region 200. The second impurity diffusion region may be formed by injecting 5.0 E15 ions/$CM^2$ at 60 KeV. The impurity is self-aligned by the spacers 18a formed on the side walls of the gate electrodes.

Accordingly, in the peripheral circuit area, the first impurity diffusion region of a low concentration using the gate electrode as a mask, and the second impurity diffusion region using the spacer 18a as a mask, are formed on an impurity diffusion region, i.e., the source and drain regions. In contrast, in a cell array area, only the first impurity diffusion region of low concentration is formed using the gate electrode as mask, so that the anisotropic etching process for forming the spacer and the high concentration impurity doping process forming the second impurity diffusion region are both omitted. Since damage to the impurity diffusion region of the cell array from the two additional processes, i.e., the etching process and the doping process, is prevented, lattice defects of the impurity diffusion region, i.e., source and drain regions, caused during the two processes, are reduced. Generally, the generation of lattice defects in the impurity diffusion region generates leakage current. In a DRAM, if leakage current is generated in the source region of a transistor due to lattice defects, the data stored in the capacitor in contact with the source region may be inverted. Also, the refresh characteristic of the device is deteriorated.

FIG. 3D shows a process for completing the cell array area and the peripheral circuit area. After the whole substrate is insulated by forming an interlayer insulting film on the whole surface of the substrate in which the second impurity diffusion region 200 has been formed, a unit process is carried out to arrange the DRAM cells of the cell array area in the form of a matrix. In more detail, a contact hole is punched on the source region of the transistor formed on the cell array area to form capacitors $C_1$ and $C_2$, each of which comprises a storage electrode 30, a dielectric film 32, and a plate electrode. An insulting film is then coated over the whole surface of the substrate on which the capacitors have been formed. Successively, the insulating film formed on the drain regions of the transistor is removed to punch a contact hole for forming a bit line 40, and a conductive material is deposited to form a bit line 40, and, in essence, completes the cell array area in which DRAM cells are arranged in the form of a matrix. The peripheral circuit area is completed by removing the interlayer insulting film formed on the impurity diffusion region of the transistor, depositing the conductive material and patterning the conductive material to form an electrode 50.

Thus, in the peripheral circuit area, since the first impurity diffusion region of a low concentration and the second impurity diffusion region of a high concentration form a single impurity diffusion region, the resistance between source and drain which was higher due to hot carrier effect, is now reduced, thereby improving the current driving capability of the transistor. Furthermore, in the cell array area, since only the first impurity diffusion region of a low concentration is formed, leakage current is prevented, thereby solving the conventional data inverting problem and refresh characteristic deterioration problem, to form a highly reliable semiconductor memory device.

FIG. 4 shows a sectional view of a semiconductor memory device manufactured by another embodiment of the present invention. In the impurity diffusion region of the peripheral circuit area having first and second impurity diffusion regions, the second impurity diffusion region is deeper than the first impurity diffusion region, so that a part of the second impurity diffusion region is included in the first impurity diffusion region. In the above embodiment illustrated in FIGS. 3A through 3D, the second impurity diffusion region is completely enclosed by the first impurity diffusion region.

FIG. 5 shows a sectional view of a semiconductor memory device manufactured by still another embodiment. In the source and drain impurity diffusion regions of the cell array area, only the first impurity diffusion region of a low concentration is formed, and then contact holes are formed for connecting the storage electrode and the bit line with the first impurity diffusion region 100. The third and fourth impurity diffusion regions 300 and 400 are formed in the first impurity diffusion region 100 through the contact holes so as to be self-aligned with the contact holes. In the source and drain impurity diffusion regions of the peripheral circuit area, the second impurity diffusion regions of high concentration is formed in addition to the first impurity diffusion regions of low concentration. As a result, the semiconductor memory device of this embodiment improves characteristics of the contacts between the impurity diffusion regions and the storage electrode and the bit line.

The present invention is not limited by the embodiments disclosed herein, and modifications can be made by those skilled in the art without departing from the scope of the claimed invention.

What is claimed is:

1. A method for manufacturing a semiconductor memory device having a cell array area and peripheral circuit area comprising the steps of:

forming a field oxide film on a first conductivity type semiconductor substrate;

laminating and etching a gate oxide film and a first conductive layer on the whole surface of said semiconductor substrate, thereby forming gate electrodes in said cell array and peripheral circuit area;

doping a second conductivity type impurity on the whole surface of the semiconductor substrate on which said gate electrodes have been formed, thereby forming a first impurity region;

forming a spacer material, on the whole surface of the semiconductor substrate on which said first impurity diffusion region has been formed;

coating a photoresist layer on the whole surface of the semiconductor substrate on which said spacer material has been formed and removing the photoresist layer on the peripheral circuit area by a photolithographic process;

removing said spacer material exposed through said photoresist layer by an anisotropic etching to form spacers on the side walls of the gate electrodes in said peripheral circuit area and then removing the remaining photoresist; and doping a second conductivity type impurity using said spacers as a mask, thereby forming a second impurity diffusion region in said peripheral circuit area.

2. A method for manufacturing a semiconductor memory device as claimed in claim 1, wherein a first conductivity type impurity is a P-type impurity and a second conductivity type impurity is an N-type impurity.

3. A method for manufacturing a semiconductor memory device as claimed in claim 1, wherein said second impurity diffusion region has an impurity concentration higher than that of said first impurity diffusion region.

4. A method for manufacturing a semiconductor memory device as claimed in claim 3, wherein an impurity concentration of said first impurity diffusion region is $10^{17}$ to $10^{18}/cm^3$ and an impurity concentration of said second impurity diffusion region is, $10^{20}$ to $10^{21}/cm^3$.

5. A method for manufacturing a semiconductor memory device as claimed in claim 3, wherein said first impurity diffusion region is formed by injecting 1.6E12 ions/$cm^2$ @ 80 KeV and said second impurity diffusion region is formed by injecting 5.0E15 ions/$cm^2$ @ 60 KeV.

6. A method for manufacturing a semiconductor memory device as claimed in claim 3, wherein said second impurity diffusion region is formed by diffusing Arsenic ions, and said first impurity diffusion region is formed by diffusion P ions.

7. A method for manufacturing a semiconductor memory device as claimed in claim 1, wherein said spacer material is an oxide film.

8. A method for manufacturing a semiconductor memory device as claimed in claim 1, wherein the thickness of said spacer material is approximately 1700Å.

9. A method for manufacturing a semiconductor memory device as claimed in claim 1, wherein said second impurity diffusion region is thinner than said first impurity diffusion region.

10. A method for manufacturing a semiconductor memory device as claimed in claim 1, wherein said second impurity diffusion region is thicker than said first impurity diffusion region.

* * * * *